United States Patent [19]

Dorler et al.

[11] 4,409,498

[45] Oct. 11, 1983

[54] TRANSIENT CONTROLLED CURRENT SWITCH

[75] Inventors: Jack A. Dorler, Wappingers Falls; Joseph M. Mosley, Hopewell Junction, both of N.Y.

[73] Assignee: International Business Machines Corporation, Armonk, N.Y.

[21] Appl. No.: 221,684

[22] Filed: Dec. 30, 1980

[51] Int. Cl.³ .................... H03K 17/16; H03K 19/092
[52] U.S. Cl. .................................. 307/454; 307/455; 307/475
[58] Field of Search ............... 307/446, 454, 455, 254, 307/475, 456–458; 330/257, 288

[56] References Cited

U.S. PATENT DOCUMENTS

| | | | |
|---|---|---|---|
| 3,501,647 | 3/1970 | Di Giacomo | 307/455 |
| 3,590,274 | 6/1971 | Marley | 307/455 X |
| 3,660,679 | 5/1972 | Ishigaki et al. | 307/254 X |
| 4,039,867 | 8/1977 | Blumberg et al. | 307/296 A X |
| 4,112,314 | 9/1978 | Gani et al. | 307/455 X |
| 4,145,621 | 3/1979 | Colaco | 307/297 X |
| 4,308,469 | 12/1981 | Cavaliere et al. | 307/455 |

OTHER PUBLICATIONS

"Current Switch Logic Circuit", by T. Cole et al, *IBM Tech. Disc. Bull.*, vol. 14, No. 1, Jun. 1971, pp. 336–337.

Primary Examiner—Larry N. Anagnos
Assistant Examiner—David R. Hudspeth
Attorney, Agent, or Firm—Sughrue, Mion, Zinn, Macpeak and Seas

[57] ABSTRACT

A current controlled gate performing a NOR function utilizes a pair of transistors acting as current mirrors that receive a DC bias through a large resistor. This bias occurs when an input transistor is positive to insure that one of the current mirror transistors will saturate when the input transistors are "off" and the other will be driven into saturation when either of the input transistors is "on". When all inputs are negative, one of the current mirror transistors saturates thereby reducing the current to the input transistors effectively to zero. The saturation results in the collector-base capacitance increasing very rapidly such that the input assumes the characteristics of a common emitter due to the large capacitance existing in the collector of the current mirror transistor. An active push-pull output is produced with a single collector path from input to output.

11 Claims, 4 Drawing Figures

TRANSIENT CONTROLLED CURRENT SWITCH
(TRANSISTOR CLAMP)

FIG. 1 TRANSIENT CONTROLLED CURRENT SWITCH (TRANSISTOR CLAMP)
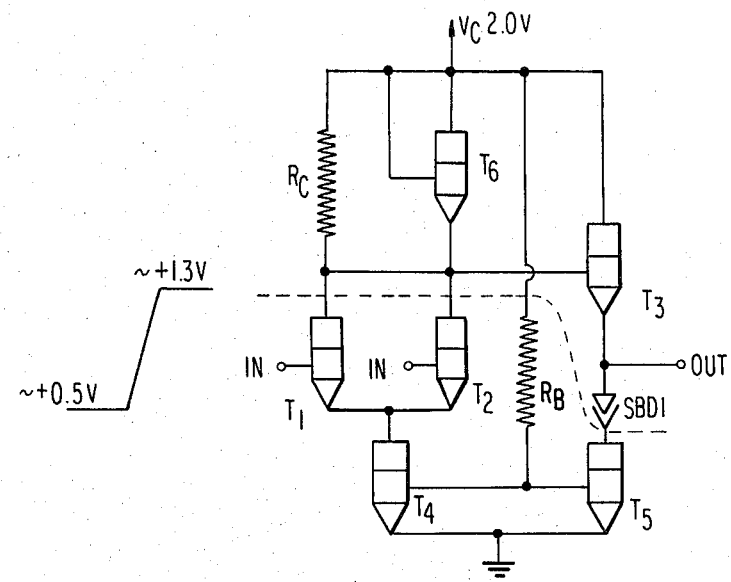
FIG. 2 TRANSIENT CONTROLLED CURRENT SWITCH (SBD CLAMP)
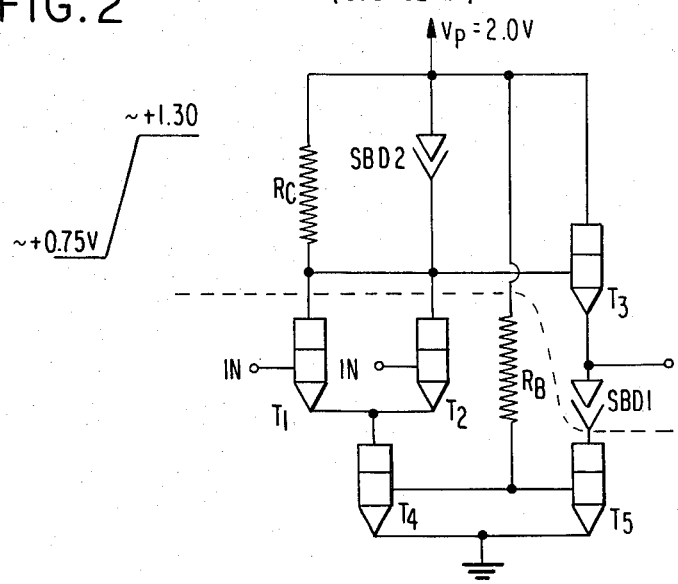

TRANSIENT CONTROLLED CURRENT SWITCH

BACKGROUND OF THE INVENTION

This invention relates to a solid state logical switch having the characteristics of a common emitter device. More particularly, the invention relates to current sourced circuits and utilizes transistor saturation to achieve high capacitance for high transition speed while reducing power requirements of the circuit.

The present invention relates specifically to a large scale integrated circuit (LSI) technology for use in high speed data processing systems and the like. Such systems require logic level translators and specifically, translators employing current switching. The prior art is replete with a host of references defining various logical current switch techniques. Typical examples are current mode switching (CML) and emitter coupled logic (ECL) circuits.

Logic level translators typically utilize current source, current switching and cathode followers to convert diode transistor logic (DTL) and transistor transistor logic (T$^2$L) level binary signals into the aforementioned CML and ECL level binary signals. This conversion is used to store and process data which is represented in binary form. Contemporary LSI data processing systems typically employ various types of logic at different portions of the system. In order to transfer data from one portion of the processing system to another, it is often necessary to translate one type of logic signal into the other type of logic signal utilizing signal translators.

These translators use diodes or other semiconductor devices to obtain a fixed voltage drop thereby translating one type of binary signal level into another. Typically, within the prior art, such translators employ a common ground shared by both the input and output signals. In the case of a T$^2$L input signal and a CML output signal, the same bus line would be used as a common ground. The T$^2$L currents flowing in the common ground bus tend to produce noise signals in the CML output portion of the translator. This is a known disadvantage of those type of switching systems. Moreover, prior art translators tend to produce unequal delays for the positive and negative going voltages of the binary signals when they are translated from T$^2$L logic to CML logic. Therefore, an important consideration in current source circuits is to eliminate the noise which is developed to prevent error signals from generating in the output of the data processing system.

Contemporary LSI techniques utilize various current controlled logic gates wherein the circuit design specifically avoids transistor saturation to enable the circuits to have relatively high speed response. Current mode switching has heretofore utilized transistors which are operated out of saturation and with relatively low voltage swing, to maintain high speed operation. The prior art, for example; U.S. Pat. Nos. 3,501,647; 3,523,194, stresses the importance of avoiding transistor saturation in such current mode circuits. When current mode switching circuits are utilized as logic gates, a difference in potential is achieved by applying a relatively high and relatively low binary signal voltage level to one transistor base electrode and a reference voltage to another transistor base electrode. An intermediate value, vis-a-vis the high and low signal levels, is assigned to the reference voltage so that a potential difference exists between the two signal levels. The reference voltage then controls which of the two transistors, generally each having separate collector circuits and a common emitter circuit, is routed through.

In such circuits, with the common emitter circuit coupled to a current source, the logic gate is commonly referred to as a current mode logic (CML) gate. In the typical CML gate, complementary outputs are taken from the collector electrodes of two transistors and each of the complementary outputs is often buffered by a separate emitter-follower transistor. Hence by using a pair of dual emitter-follower transistors, the CML gate exhibits low output impedance and provides signal shift levels so that the output digital voltage level matches the binary input signal.

The benefits of output emitter-follower transistors are well documented, and their principal disadvantage, accounting for the majority of the power dissipation in the CML gate is also well known. Power dissipation in such circuits is broadly recognized as undesirable, but in the context of LSI technology the dissipated heat can especially degrade performance. Prior art attempts to reduce power dissipation such as U.S. Pat. No. 3,549,899 and 3,549,900 use load-current switches so that the emitter current of only one of the dual emitter follower output transistors flows through the common load current path of the gate.

While power dissipation is reduced, the circuit becomes more complicated due to the requirement of additional elements. Accordingly, problems in layout on the chip are increased and penalties in terms of increased chip area and incurred. These problems exist when temperature compensation elements are introduced into the circuit as an alternative to load current switches. However, if computing speed is deemed to be essential, the trade-off of chip area is acceptable. It is well recognized that computing speed, power, and chip area interact and a change in one has an impact on the other two.

Prior art circuits such as U.S. Pat. No. 3,590,274 employ stabilizing circuits to maintain the two different output levels of a CML gate (operating as a NOR) constant over changes in ambient temperature. Such stabilizing circuits recognize power dissipation problems and regulate the output over changes in chip temperature occurring as a result of dissipated heat.

In the known prior art current emitter transistor circuits, operation is maintained outside of saturation. The literature conspicuously avoids driving transistors into saturation given the apparent disadvantages.

A host of references have been considered relative to considering utilizing transistor saturation as a positive aspect of circuit running speed. Within the prior art, it was previously thought that current source saturation resulted in transistor operations out of design specifications and therefore an undesirable technique of circuit operation. The following references are illustrative of a number of prior art current mode logic switching circuits all utilizing transistor operation outside of the saturated regime.

| U.S. Pat. No. | U.S. Pat. No. |
|---|---|
| 3,437,831 | 3,636,384 |
| 3,445,680 | 3,648,061 |
| 3,450,896 | 3,679,917 |
| 3,458,719 | 3,686,512 |
| 3,501,647 | 3,728,560 |
| 3,509,363 | 3,731,120 |

-continued

| U.S. Pat. No. | U.S. Pat. No. |
| --- | --- |
| 3,522,446 | 3,758,791 |
| 3,523,194 | 3,760,190 |
| 3,535,546 | 3,778,646 |
| 3,539,824 | 3,787,737 |
| 3,549,899 | 3,816,758 |
| 3,549,900 | 3,942,033 |
| 3,590,274 | 3,955,099 |
| 3,622,799 | 3,959,666 |
|  | 4,112,314 |

IBM Technical Disclosure Bulletin publication entitled "Current Sources" by T. G. Cole et al., Vol. 14, No. 1, June 1971, pages 332-3;

IBM Technical Disclosure Bulletin publication entitled "Emitter-Coupled Logic Circuit" by H. Berger, Vol. 14, No. 5, October 1971, page 1610; and IBM Technical Disclosure Bulletin publication entitled "Low Power Data-In" by S. J. Park, Vol. 18, No. 10, March 1976, page 3249.

These prior art devices require either junction capacitors or metalization capacitors to achieve bypass resistor techniques. As a result, in the context of a LSI environment, valuable chip area is required to form the necessary capacitance elements. Of the three basic parameters of LSI circuit design, power, speed and chip area, prior art current mode logic devices have tended to maintain power and speed of the system while compromising chip area. This compromise has resulted in increased chip cost. In certain applications cost-performance analysis favors performance, however in commercial areas, cost competitiveness is an essential consideration. As circuit counts increase, sacrifices in chip area become undesirable.

In commercial LSI technology cost is an important criteria in masterslices with circuits having counts in the range of 1500-5000. In such a range, the allowable internal circuit power dissipation is generally in the range of 0.3 to 2.0 mw. At such low power operation, the ability to drive a high capacitance net is a difficult but necessary criteria. The achievement of a current controlled gate operating at low power and at the same speed as conventional current mode switching circuits remains an important area of semiconductor research.

SUMMARY OF THE INVENTION

Given the known deficiencies of the prior art in terms of noise tolerance, the requirement for bypass capacitors, chip area, or lower speed operation, the present invention provides a novel approach to a current controlled gate. The present invention departs significantly from the prior art by specifically operating a current emitter device in the saturated mode. Specifically, the present invention eliminates bypass capacitance techniques with the capacitance achieved through transistor saturation. In prior art T²L devices, the switching current determines the power during the DC state. However, in the present invention, high power is expended only during transition so that during the DC state, minimum power dissipation occurs. At low current levels, power dissipation is minimized to negligible levels because the current source is operated in saturation.

Accordingly, it is an object of this invention to define a current controlled gate utilizing the high base to collector capacitance of the saturated transistor.

Another object of this invention is to eliminate bypass capacitors in current controlled gates thereby significantly reducing the required chip area in a LSI.

Yet another object of this invention is to define a semiconductor gate performing a NOR function with minimum power dissipation in low DC operating states.

A still further object of this invention is to define a current controlled gate having the characteristics of a common emitter device due to the high base to collector capacitance of a saturated transistor.

These and other objects of this invention are achieved by means of a novel current controlled gate utilizing one or more input transistors and a pair of transistors operating as current mirrors. Any number of input transistors can be utilized without affecting the operation of this circuit. The low DC current to the current mirror transistor is controlled by a DC bias through a large resistor. This bias occurs when any input transistor is positive to assure that one of the current mirror transistors will saturate when the input transistors are "off" and the other will saturate when either of the input transistors is "on". When all inputs are negative, one of the current mirror transistors saturates thereby reducing the current to the two input transistors effectively to zero. The saturation of this transistor results in the collector base capacitance increasing very rapidly thereby having the input device assume the characteristic of a common emitter device due to the large capacitance existing in the collector of the current mirror transistor.

The positive transition seen at the input transistor is thereby initially coupled through this capacitance to the bases of both current mirror transistors. The transistors see a large positive signal in the form of a large overdrive at their base inputs greatly increasing the collector currents.

A Schottky Barrier Diode coupled between the collectors of the output pull down transistors reduces the larger than necessary down level voltage when the input to the input transistor is positive. This saturation occurs only after the output voltage has been reduced to a low level.

This invention will be described in greater detail by referring to the drawings and description of the preferred embodiments that follow.

BRIEF DESCRIPTION OF THE DRAWINGS

FIG. 1 is a circuit drawing showing a first embodiment of a current controlled gate in accordance with the present invention;

FIG. 2 is a circuit diagram showing a second embodiment of a current controlled gate in accordance with the present invention.

DESCRIPTION OF THE PREFERRED EMBODIMENTS

Referring now to FIG. 1, a first embodiment of this invention is shown. The current controlled gate of FIG. 1 performs a logic NOR function having a controlled current source, an active push-pull drive, and a single collector path from the inputs to the output. The power supply $V_c$, resistor $R_B$, and transistors T4 and T5 form a current source. Two logical inputs are provided to the bases of transistors T1 and T2. It will be appreciated that while two input transistors are shown in this embodiment, the invention is not so limited. Transistors T4 and T5 are coupled as a current mirror having a common coupling between bases and their emitters coupled to ground. Transistor T3 acts as an emitter follower.

The resistor $R_B$ supplies sufficient base drive to the transistors T4 and T5 to assure that T4 will be saturated when the input transistors T1 and T2 are "off" and that the transistor T5 will saturate when either input transistor is "on". Given the emitter follower arrangement with transistor T3, when T5 is saturated the base and emitter nodes of the output emitter follower transistor T3 will be pulled down. Accordingly, with the inputs at a logical "0" the power supply defines $I_{SAT}$ for transistor T4. If either of the inputs of T1 or T2 are at a logical "1", $R_B$ defines $I_{SAT}$ for transistor T5. The low DC current in either T4 or T5 is controlled by the value of $R_B$ to the supply voltage.

If the input of T1 and T2 are both at a logical "1" state, the feedback path is defined in FIG. 1 between $R_B$, T5, T4, Schottky Barrier Diode SBD1 and resistor $R_c$ to insure that a logical "0" output exists. Conversely, when both inputs are negative, T4 will saturate thereby reducing the currents in T1 and T2 essentially to zero.

An important aspect of the present invention is the use of the high base-collector capacitance of the saturated transistors T4 or T5 to couple power during transitions. As a result, during low current DC operation, minimum power dissipation occurs.

Figure 3:
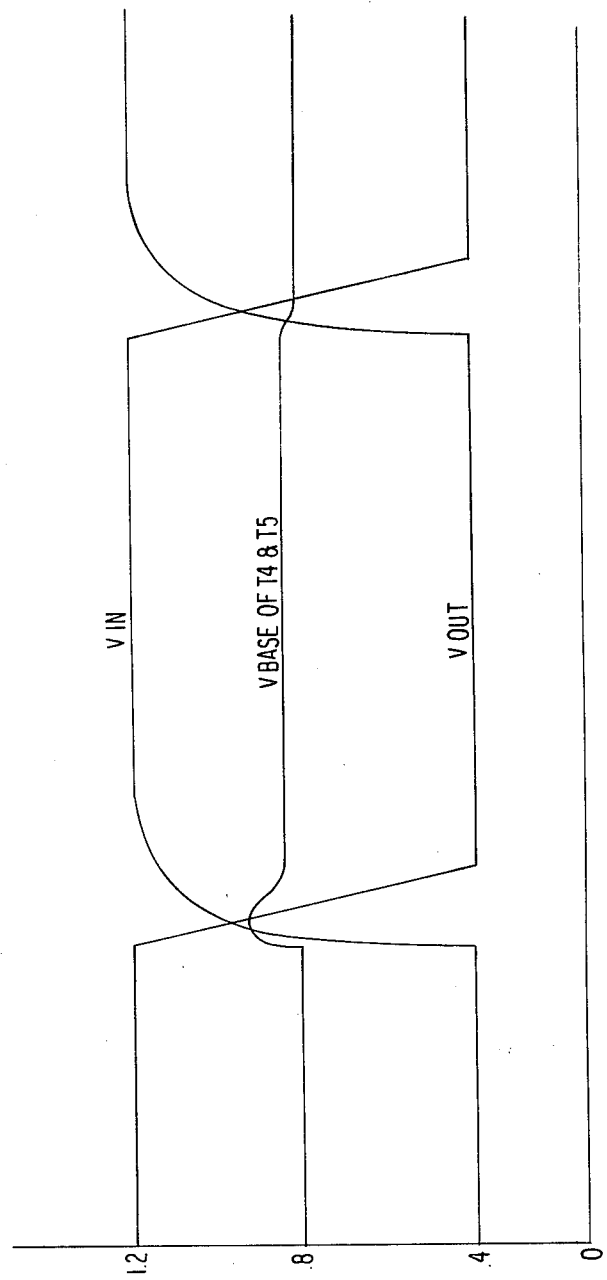
FIG. 3 shows voltage wave forms showing the operation of this invention.

The saturation of T4 occurring when the input transistors T1 and T2 are "off" results in the collector-base capacitance of that transistor to significantly increase at a rate of hundreds of pf/ma. Accordingly, a positive going waveform appearing at either T1 or T2 is initially coupled through this capacitance to the bases of T4 and T5. This coupling produces two effects. The first is that the input transistors T1 and T2 assume the characteristic of a common emitter device because of the large capacitance of the collector of T4. Secondly, T4 and T5 receive a large positive signal in the form of a DC overdrive at their respective base inputs, thereby significantly increasing the collector current. In the other state, Schottky Barrier Diode SBD1 assures the saturation of T5 when either input is positive. However, as shown in FIG. 3, this occurs only after the output voltage has been pulled to a low level. T5 is turned "on" when the base of emitter follower transistor T3 is negative and conversely, T5 is turned "off" when the base of T3 is positive.

Considering now the operation of the circuit of FIG. 1 for various input modes of a NOR gate, the case of the down level condition, will first be considered.

Considering first the negative transition edge, as T1 goes negative, the current demands of T4 cause it to saturate almost instantaneously. It is noted that the value of resistor $R_B$ is relatively large and as a result, T4 does not saturate through the base. Rather, saturation occurs through the collector of T4. The collector-base capacitance increases very rapidly, reducing the currents in T1 and T2. The base of emitter follower transistor T3 goes positive, tending to pull the output positive.

In the input down level, T1 and T2 are "off" with currents effectively zero. T4 is driven in saturation and T3 is supplying the up level voltage. In the input down level, transistor T5 is not saturated but is minimally turned on. In this condition, T5 has insignificant current demands, thereby effectively requiring little or no power. Accordingly, in the input down state, essentially there is no current flow and at those low current levels, effectively no power dissipation takes place.

Figure 4:
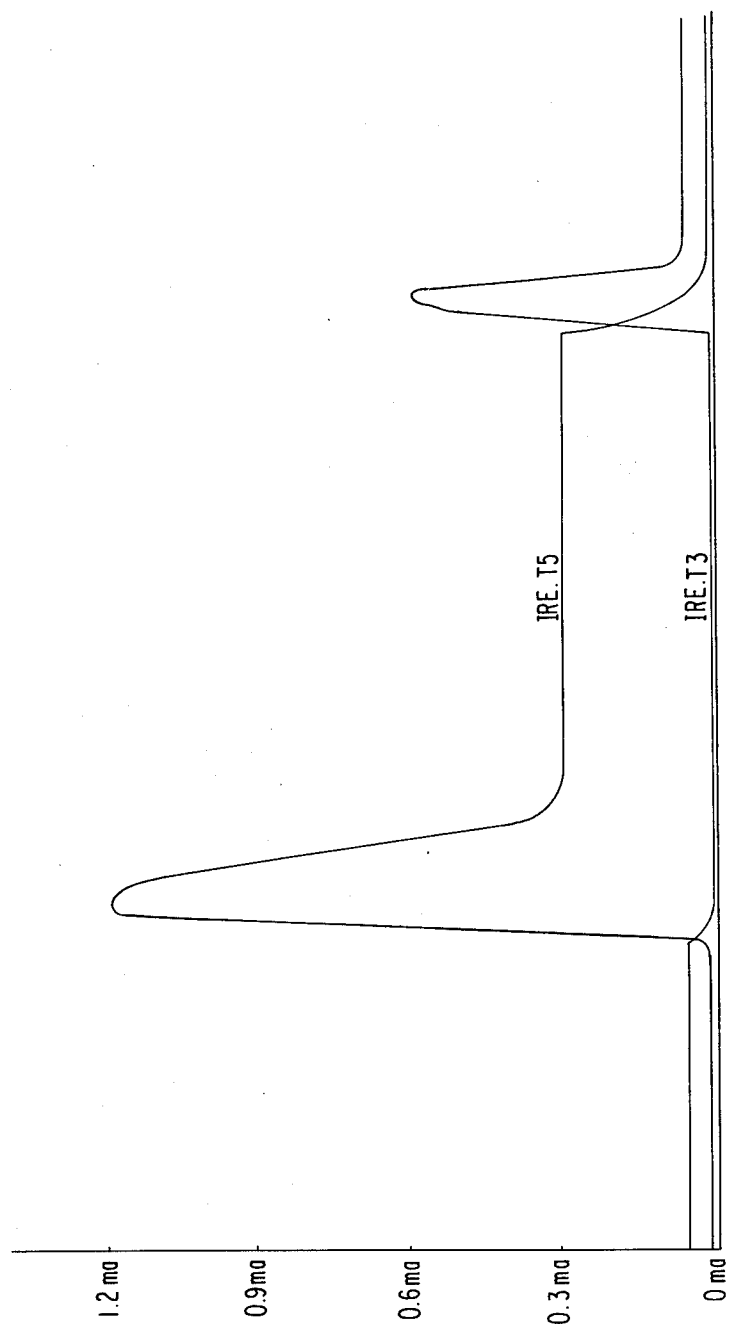
FIG. 4 are corresponding current wave forms showing the operation of this invention.

Consider next the positive going edge during transition from a low level to a high level. Input transistor T1 or T2 tends to go positive and the respective emitters see a large value of capacitance in transistor T4. The respective emitters are therefore held by this capacitance and T4 is turned on very hard driving the base of transistor T3 negative. Accordingly, the upgoing transition voltage dv/dt at T1 is seen at T4 with its base being pulled positively very rapidly. Given the current mirror effect, T4 and T5 are turned on very high eliminating the saturation capacitance at the base-collector junctions of T4. The current demands of T5, approximately 3-4 times the low level DC value, produce a push-pull drive in the output net. Accordingly, the collector current of T5 significantly increases turning T5 on when the base of T3 is negative. The result, as shown in FIG. 4, is that T5 turns on very hard receiving current to approximately 1 milliamp or approximately 3-4 times higher than the 0.3 milliamp "on" level current.

Finally, consider the case where the input at T1 or T2 is high. With the input high, T1 or T2 will turn on taking transistor T4 out of saturation. Transistor T1 receives current from the combination of resistor $R_c$ and clamp transistor T6. As a result of transistor T1 turning on, emitter follower transistor T3 drops to a low level and the output is held negative by the capacitance net and the T3 emitter follower. As shown in FIG. 1, the value of $R_c$ sets the power for current operation. The amount of power dissipation through the circuit during a positive input is therefore a function of $R_c$. The lower the value of $R_c$, the higher the power and conversely, the higher the value of $R_c$, the lower the power through the system. The circuit power requirement is then ($V_c$) multipled by the the current demand of T4 and T5.

A second preferred embodiment of this invention is shown in FIG. 2 wherein the transistor T6 is replaced by a second Schottky Barrier Diode SBD2. The embodiment of FIG. 1 allows for greater current swing and noise margins but the replacement of the transistor with the Schottky Barrier Diode limits the voltage swing. It however increases the speed of the circuit. The Schottky Barrier Diode SBD2 prevents either of the input transistors T1 or T2 from being driven into saturation.

Accordingly, by utilizing the high base to collector capacitance by transistors driven in saturation, the present invention allows for LSI circuits to be constructed requiring less area, less power while operating at the same speed as prior art techniques utilizing junction or metalization capacitance. A logical NOR function is accomplished together with push-pull output. Accordingly, a novel current controlled gate is defined achieving fast operation yet requiring low power. Importantly, significant savings in chip area are realized by utilizing transistors driven to saturation to achieve power dissipation during transition and therefore suffer from no power dissipation during low current level operation.

It is apparent that modifications of these preferred embodiments can be made without departing from the essential scope of this invention.

We claim:

1. A current controlled gate comprising at least one input transistor receiving a logic input signal, a voltage source, a pair of transistors coupled to operate as a current mirror, means coupled to said voltage source and to the bases of said pair of transistors to insure that one of said pair of transistors will be driven into saturation dependent on the state of said input transistor, and an output transistor connected to said voltage source and responsive to said input transistor state and a current from said current mirror which is dependent upon the saturation state of one of said pair of transistors to produce a logic output.

2. The current controlled gate of claim 1 wherein said at least one input transistor comprises a pair of input transistors, and wherein said logic input signal comprises two logic input signals, each of said pair of input transistors receiving said two logic input signals, and wherein said current controlled gate performs a NOR function.

3. The current controlled gate of claim 2 wherein said means coupled to said voltage source and to the bases of said pair of transistors comprises a resistor coupled to said voltage source, said resistor delivering current to the bases of said pair of transistors to saturate one when the input state of any one of said pair of input transistors is at a logical low level, and saturating the other of said pair of transistors coupled to operate as a current mirror when the state of any one of said at least said pair of input transistors is at a logical high level.

4. The current controlled gate of claim 3 wherein said output transistor is coupled to said pair of transistors as an emitter follower.

5. The current controlled gate of claim 4 further comprising a Shottky Barrier Diode coupling the emitter of said output transistor to the collector of one of said pair of transistors to drive said one transistor into saturation only after the output from said output transistor has been brought to a low level.

6. A current controlled gate comprising: a transistor input section receiving a logic input, means defining a controlled current source, including a current mirror comprising a pair of base-coupled transistors selectively driven into saturation as a function of said logic input to thus selectively increase base-collector capacitances of said base-coupled transistors as a function of said logic input, and transistor means defining an active push-pull output wherein a single collector path exists between said transistor input section and said push-pull output, said emitter of said push-pull transistor means being connected to said current mirror to complete said push-pull output.

7. The current controlled gate of claim 6 further comprising diode means coupled between said controlled current source and said transistor means defining a push-pull output, said diode means driving said current mirror coupled transistors into saturation only after the push-pull output has been driven to a low level.

8. The current controlled gate of claim 6 wherein said transistor input comprises first and second transistors having their respective emitters coupled to the collector of one of said current mirror coupled transistors, said gate performing a NOR function by receipt of respective inputs to said input section and producing a NOR output.

9. The current controlled gate of claim 6 wherein said controlled current source comprises a source of input voltage, and a first resistor and a clamp transistor in parallel receiving said input voltage and coupled to said transistor input section.

10. The current controlled gate of claim 6 wherein said controlled current source comprises a source of input voltage, and a first resistor and a Scottky Barrier Diode in parallel receiving said input voltage and coupled to said transistor input section.

11. The current controlled gate of claims 9 or 10 further comprising a second resistor coupled to said source of input voltage and the bases of said current mirror transistors.

* * * * *